(12) United States Patent
Clark et al.

(10) Patent No.: US 6,767,793 B2
(45) Date of Patent: Jul. 27, 2004

(54) STRAINED FIN FETS STRUCTURE AND METHOD

(75) Inventors: William F. Clark, Essex Junction, VT (US); David M. Fried, Ithaca, NY (US); Louis D. Lanzerotti, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/405,844

(22) Filed: Apr. 2, 2003

(65) Prior Publication Data

US 2003/0178681 A1 Sep. 25, 2003

Related U.S. Application Data

(62) Division of application No. 10/101,807, filed on Mar. 19, 2002.

(51) Int. Cl.[7] .............................................. H01L 21/336
(52) U.S. Cl. ...................... 438/286; 438/149; 438/157; 438/267; 438/283; 438/268
(58) Field of Search .................................. 438/149, 151, 438/156, 157, 179, 267, 268, 283, 303, 304, 285, 590; 257/192

(56) References Cited

U.S. PATENT DOCUMENTS

| | | | | |
|---|---|---|---|---|
| 6,252,284 B1 | * | 6/2001 | Muller et al. | 257/412 |
| 6,399,970 B2 | | 6/2002 | Kubo et al. | |
| 6,413,802 B1 | * | 7/2002 | Hu et al. | 438/151 |
| 6,458,662 B1 | * | 10/2002 | Yu | 438/286 |
| 6,475,869 B1 | * | 11/2002 | Yu | 438/303 |
| 6,492,212 B1 | * | 12/2002 | Ieong et al. | 438/157 |
| 6,512,252 B1 | | 1/2003 | Takagi et al. | |
| 6,610,576 B2 | * | 8/2003 | Nowak | 438/301 |

FOREIGN PATENT DOCUMENTS

EP     0 921 575 A2     6/1999

* cited by examiner

Primary Examiner—Maria Guerrero
(74) Attorney, Agent, or Firm—McGinn & Gibb, PLLC; Mark F. Chadurjian, Esq

(57) ABSTRACT

A method and structure for a transistor that includes an insulator and a silicon structure on the insulator. The silicon structure includes a central portion and Fins extending from ends of the central portion. A first gate is positioned on a first side of the central portion of the silicon structure. A strain-producing layer could be between the first gate and the first side of the central portion of the silicon structure and a second gate is on a second side of the central portion of the silicon structure.

18 Claims, 17 Drawing Sheets

STRAINED FIN FETS STRUCTURE AND METHOD

CROSS-REFERENCE TO RELATED APPLICATIONS

This application is a division of U.S. patent application Ser. No. 10/101,807 filed Mar. 19, 2002.

BACKGROUND OF THE INVENTION

1. Field of the Invention

The present invention generally relates to the field of semiconductor manufacturing and, more specifically, to a method for forming double-gated field effect transistors.

2. Description of the Related Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever-increasing device densities is particularly strong in complementary metal oxide semiconductor (CMOS) technologies, such as the in the design and fabrication of field effect transistors (FETs). FETs are used in almost all types of integrated circuit design (i.e., microprocessors, memory, etc.). Unfortunately, increased device density in CMOS FETs often results in degradation of performance and/or reliability.

One type of FET that has been proposed to facilitate increased device density is a double gated field effect transistor. Double gated FETs use two gates, one on each side of the body to facilitate scaling of CMOS dimensions while maintaining acceptable performance. In particular, the use of the double gate increases the gate area, which allows the transistor to have better current control without increasing the gate length of the device. As such, the double gated FET is able to have the current control of a larger transistor without requiring the device space of the larger transistor.

Unfortunately, several difficulties arise in the design and fabrication of double gated CMOS transistors. First, the relative dimensions of a double gated transistor are such that it is difficult to reliably fabricate one that has reliable performance and minimum feature size. Second, the threshold voltage of a double gated transistor is highly dependent upon the material used for the two gates. In particular, current fabrication techniques have generally resulted in a double gated transistor that has either too high a threshold voltage or too low a threshold voltage. For example, if the gates are doped the same polarity as the source, the threshold voltage will generally be near zero. Conversely, if the gates are doped the opposite polarity of the source, then the threshold voltage will be approximately one volt. Neither result is desirable in most CMOS applications.

Thus, there is a need for improved device structures and methods of fabrication of double gated CMOS devices that provide improved threshold voltage of the resulting double gated CMOS without overly increasing fabrication complexity.

Physical stain on the channel material in FET can improve carrier mobility. Strain induced on planar p-type metal oxide semiconductor field effect transistor (MOSFET) devices has been shown to increase hole mobility up to 30%. This invention provides these advantages to thin semiconductor bodies that are vertically arranged on a substrate; as such, the invention combines greater channel control with greater carrier mobility.

SUMMARY OF THE INVENTION

The asymmetric strained Fin Field effect transistor has an insulator and a semiconductor structure on the insulator. The structure includes a central portion and first and second ends extending from the central portion. A first gate is positioned on a first side of the central portion of the structure, a strain-producing layer between the first gate and the first side of the central portion of the structure, and a second gate on a second side of the central portion of the structure. The insulator is a buried oxide layer and the central portion of the structure is silicon. The strain-producing layer has a sufficient concentration of germanium to produce strain within he central portion to enhance carrier mobility without producing sufficient dislocations to reduce overall performance of the transistor. The first and second ends are source and drain regions, respectively. The concentration of germanium is between 10% and 40%. The different gates may be doped differently to adjust VT. The gates may also be doped similarly.

The symmetric strained Fin field effect transistor has an insulator and a semiconductor structure on the insulator. The structure is a Fin body having a central portion having silicon and silicon germanium and end portions comprising silicon. A first gate is positioned on a first side of the central portion of the silicon structure and a second gate is on a second side of the central portion of the structure. The first gate and the second gate may again be doped similarly or differently (as with the asymmetric strained situation).

The method of forming a transistor includes forming a silicon layer on an insulator, etching a first portion of the silicon layer to create a first opening, depositing a first gate in the first opening and etching a second portion of the silicon layer to create a second opening opposite the first opening. After the etching of the second portion, the silicon layer has a silicon structure on the insulator having a central portion and Fins extending from ends of the central portion. The invention forms a strain-producing layer upon a portion of the silicon structure facing the second opening which forms a second gate in the second opening, and removes the first gate and the second gate from all portions of the silicon structure except from the central portion.

The method of forming an asymmetric strained Fin field effect transistor includes forming a silicon layer on an insulator, etching a first portion of the silicon layer to create a first opening, depositing a first gate in the first opening, etching a second portion of the silicon layer to create a second opening opposite the first opening. After the etching of the second portion, the silicon layer has a silicon structure on the insulator having a central portion and Fins extending from ends of the central portion. The invention forms a silicon germanium layer upon a portion of the silicon structure facing the second opening, forms a second gate doped differently or similarly to the first gate in the second opening and removes the first gate and the second gate from all portions of the silicon structure except the central portion.

The method of forming strained Fin field effect transistors includes forming a silicon structure on an insulator, forming stress on one or both sides of the silicon structure, having a central portion and Fins extending from ends of the central portion, depositing a first gate and a second gate on sides of the silicon structure, and removing the first gate and the second gate from all portions of the silicon structure except the central portion.

Physical strain on the channel material in FET can improve carrier mobility. Strain induced on planar p-type metal oxide semiconductor field effect transistor (MOSFET)

devices has been shown to increase hole mobility up to 30%. This invention provides these advantages to thin semiconductor bodies that are vertically arranged on a substrate; and, as such, the invention combines greater channel control with greater carrier mobility.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

This invention relates to enhanced Fin FET devices and builds strain into such devices. The present invention is implemented using a "Fin" type FET double gated, structure. In a Fin FET type structure, the double gates are formed on each side of the body, with the body being disposed horizontally between the gates. The invention produces a Fin FET that has a channel body that is strained through the operation of a silicon germanium layer. Processing is started on a wafer that is built, potentially through wafer bonding, to include a silicon bulk wafer on the bottom, a relatively thick bottom oxide layer and a relaxed SiGe layer on top. A thin Fin is then etched out of the SiGe, stopping on the BOX layer. A thin layer of epitaxial silicon can then be grown onto the Fin. Due to the difference in the crystalline lattice constant of Silicon and SiGe, the epitaxial layer will grow under strained conditions. The invention can be included in, symmetrical or asymmetrical gate workfunction Fin FET devices.

Figure 28:
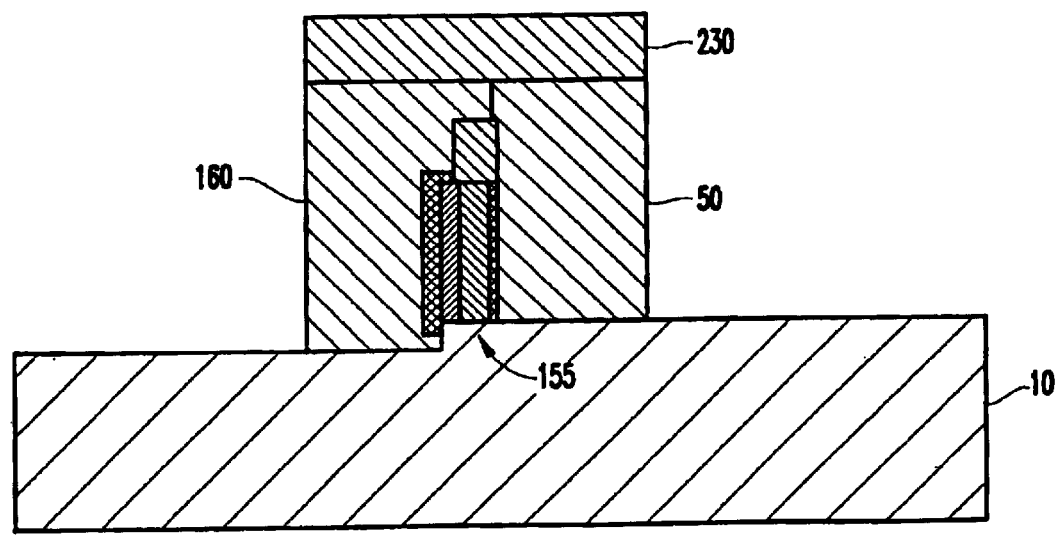
Figure 29:
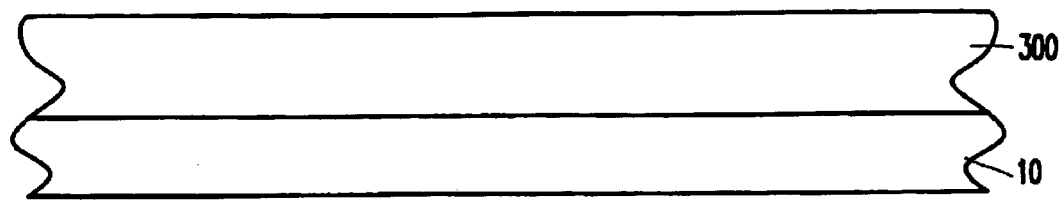
FIGS. 29–31 are cross-sectional views of the second embodiment of a FET structure produced utilizing a method in accordance with a second embodiment of the invention.
Figure 30:
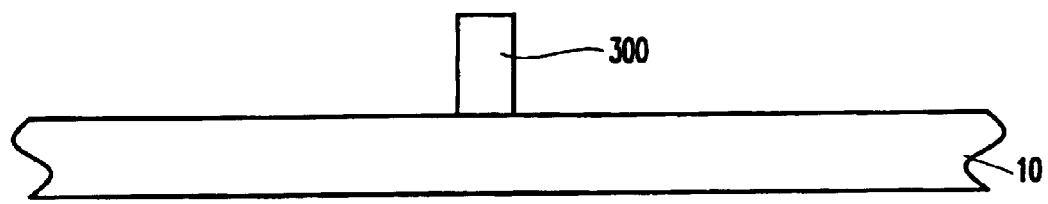
Figure 31:
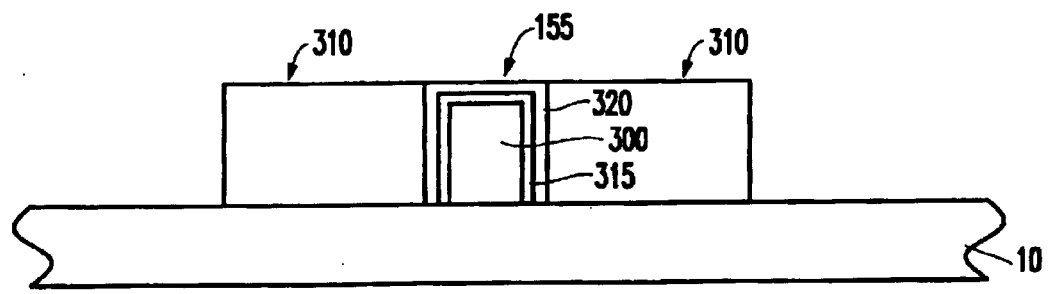

While the invention is described above with respect to an asymmetric strained Fin FET, it is equally applicable to a symmetric strained Fin FET. More specifically, as shown in FIGS. 29–31, the processing necessary to create a strained symmetric strained Fin FET in accordance with a second embodiment of the invention starts with a SOI structure having a SiGe layer 300 above and insulator 10 (this is shown in FIG. 29). The SiGe layer 300 is selectively patterned, as shown in FIG. 30. Then, a silicon layer 315 is grown on the SiGe layer 300 to create a strained structure. A thermal oxide 320 is then grown on the silicon layer 315. Next, the gate conductors (e.g., polysilicon) 310 are deposited, planarized, and patterned to form the gates surrounding the body structure 155. In one embodiment, the gate conductors 310 have the same doping concentration and material makeup. However, in a different embodiment, the gate electrodes 310 can be made asymmetric with, for example, an ion implant, to result in an asymmetric gate workfunction Fin fet with strain. More specifically, in the asymmetric gate arrangement, the gate conductors 310 would have different doping concentrations or utilize different dopants. Processing proceeds to complete the structure shown in FIGS. 18–28, as discussed above.

An important feature of the invention is that it provides strain within many different forms of Fin FETs. One of the strained Fin FET embodiments shown in FIGS. 1–28 utilizes an SOI arrangement to formed a strained Fin FET that has either symmetric or asymmetric gate conductors. Alternatively, as explained with respect to FIG. 15, if the oxide 150 is omitted, a dynamic threshold Fin FET is formed. To the contrary, the embodiment shown in FIGS. 29–31 utilizes a SiGe-OI (silicon germanium over insulator) in place of the SOI structure shown in FIGS. 1–28. In a similar manner, the SiGe-OI structure can be formed as an asymmetric gate or symmetric gate structure depending upon the doping of the gate conductors. The forgoing embodiments are merely illustrative of the invention and the invention is not limited to these specific embodiments. Instead, the embodiments shown above are merely examples and one ordinarily skilled in the art would understand that many different types of Fin FETs would achieve beneficial results by including the inventive strain structure.

Figure 1:
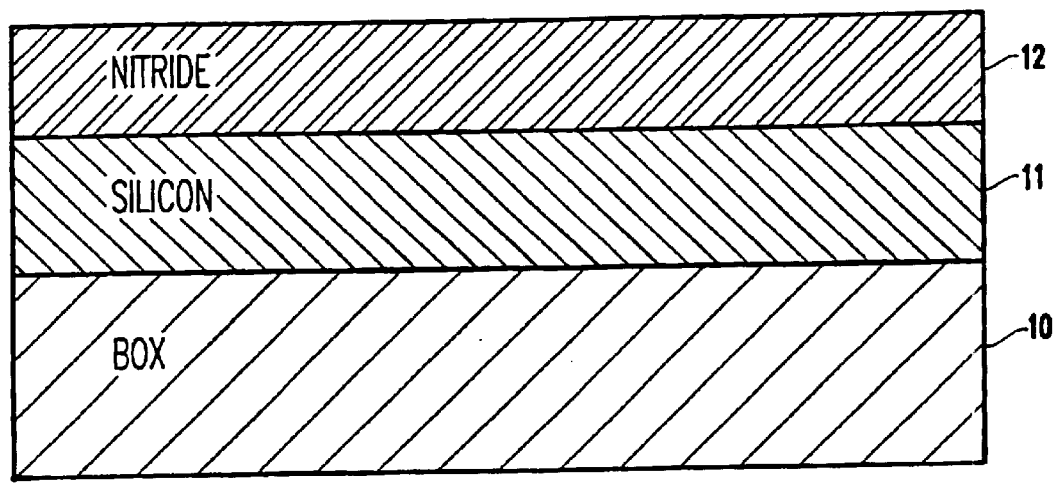
FIGS. 1–20,22,24 and 25 are cross-sectional views of a first embodiment of a FET structure produced utilizing a method according to a first embodiment of the invention.
Figure 2:
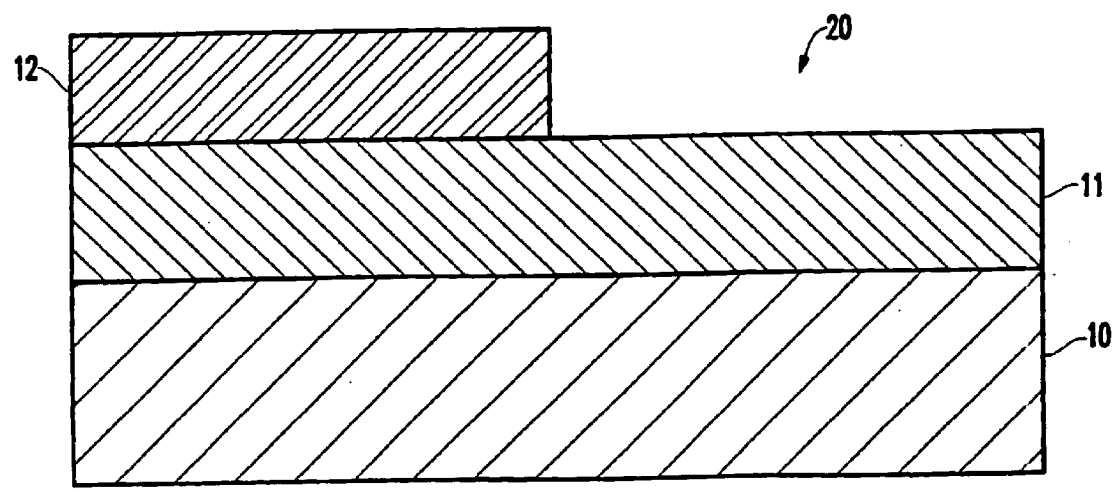
Figure 3:
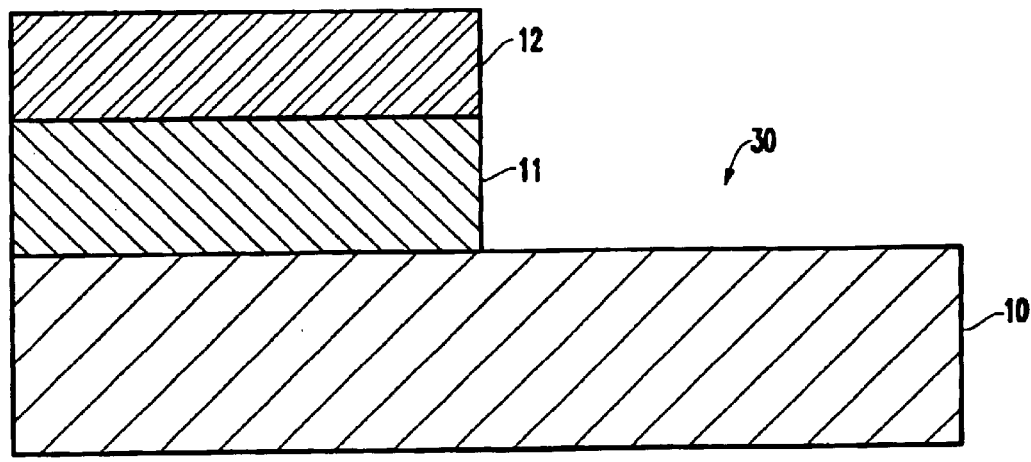

The formation of a Fin FET according to a first embodiment of the invention is shown in FIGS. 1–28. Processing begins as shown FIG. 1 where a silicon over an insulator (SOI) structure includes an insulator 10 such as a buried oxide layer with an overlying silicon layer 11. A placeholder layer 12 (such as a nitride, etc.) is deposited over the silicon layer 11. This structure is then patterned using well-known conventional patterning processes, as shown in FIG. 2, to remove a portion 20 of the placeholder layer 12. A subsequent etching step removes any corresponding portion 30 of the silicon layer 11 not protected by the placeholder 12, as shown in FIG. 3.

Figure 4:
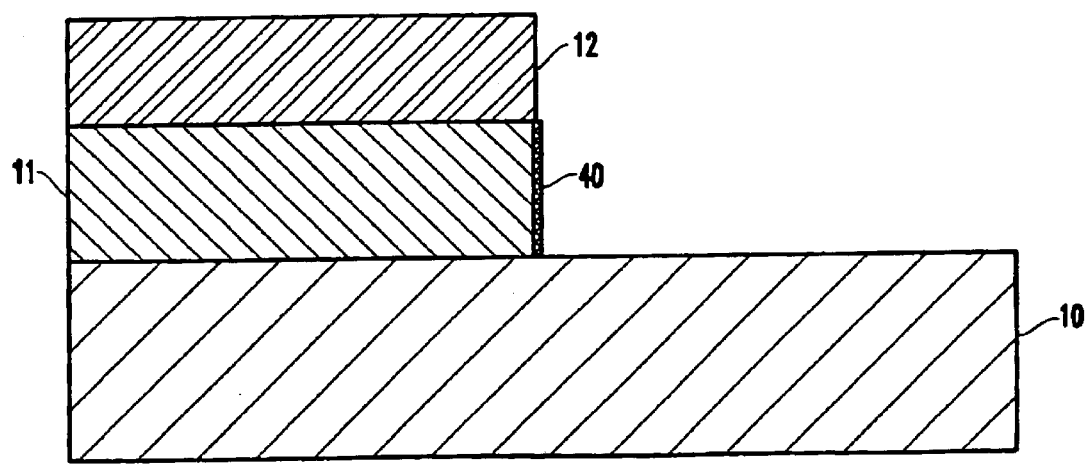
Figure 5:
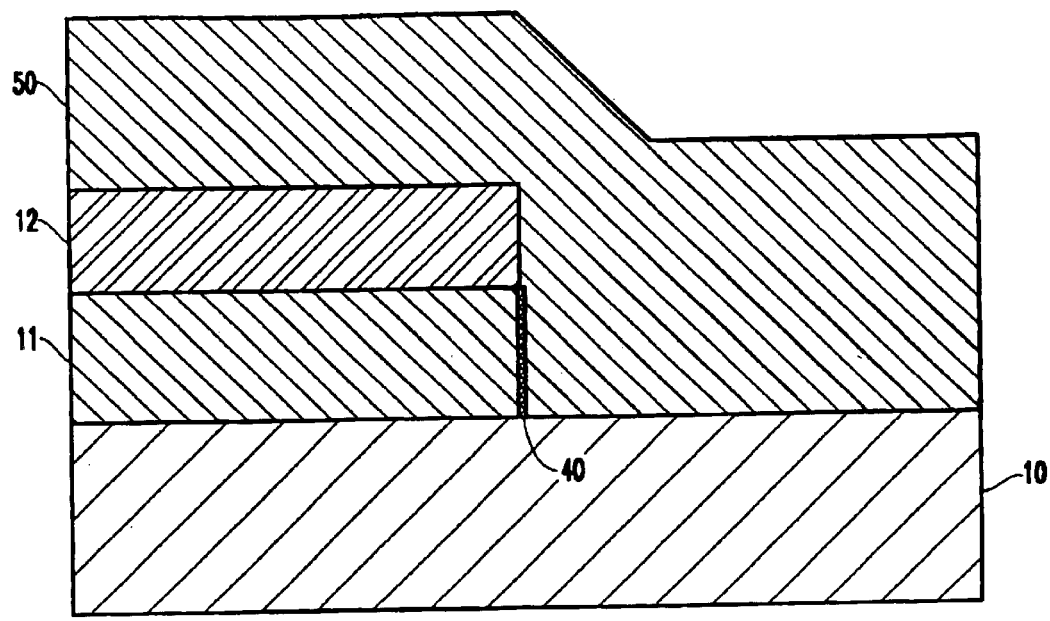
Figure 6:
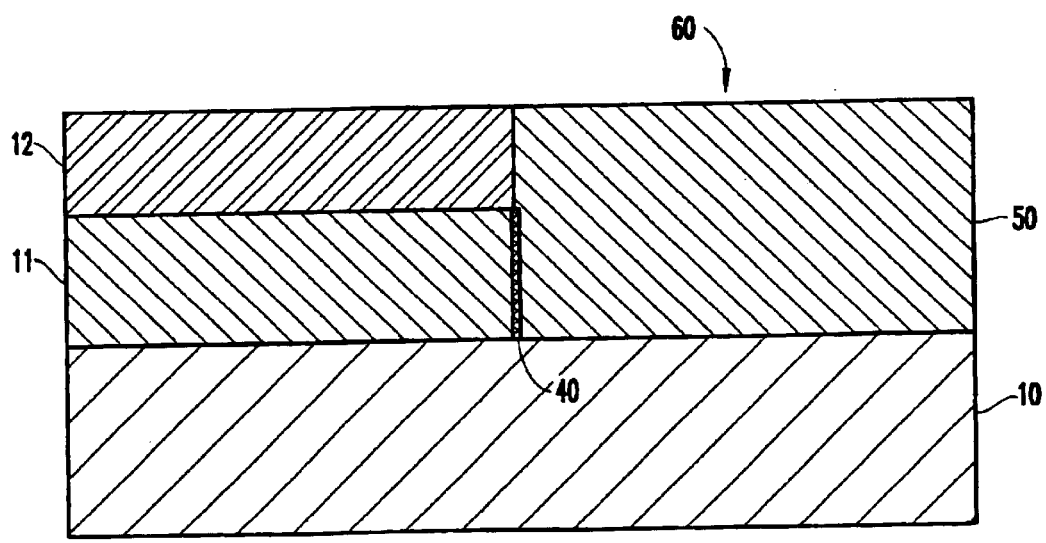
Figure 7:
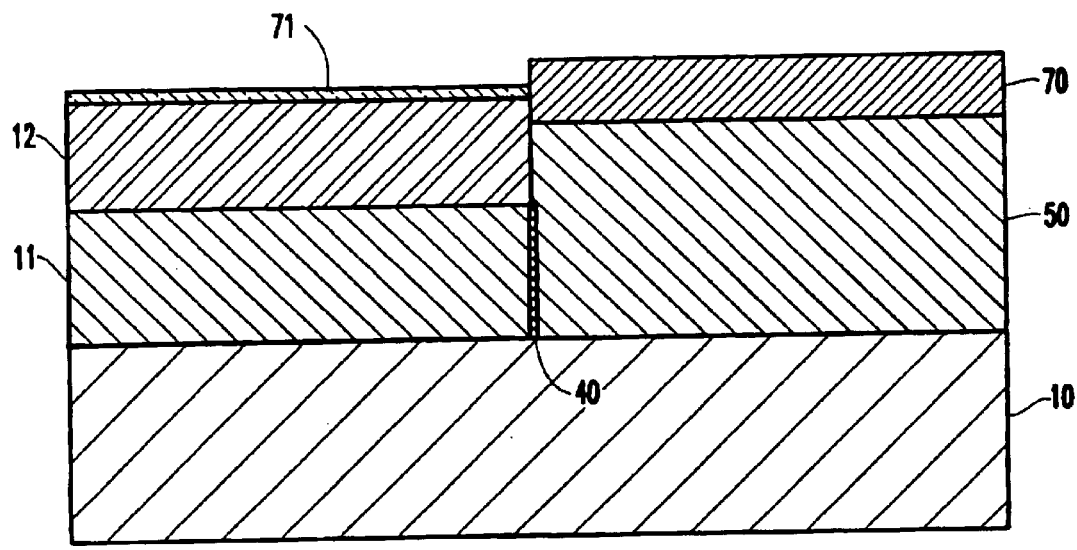

In FIG. 4, an oxidation process grows a gate oxide layer 40 on the silicon 11. Next, polysilicon 50 is deposited over the structure, as shown FIG. 5. The polysilicon 50 is of one dopant type (e.g., N+doped polysilicon, etc.). In FIG. 6, the structure is planarized using, for example, a chemical mechanical polishing (CMP) process to form planar layer 60. FIG. 7 illustrates an oxidation process in which the doped polysilicon 50 oxidizes at a faster rate than the placeholder material 12. Therefore, the oxide layer 70 over the polysilicon 50 is thicker than the oxide layer 71 over the placeholder layer 12.

Figure 8:
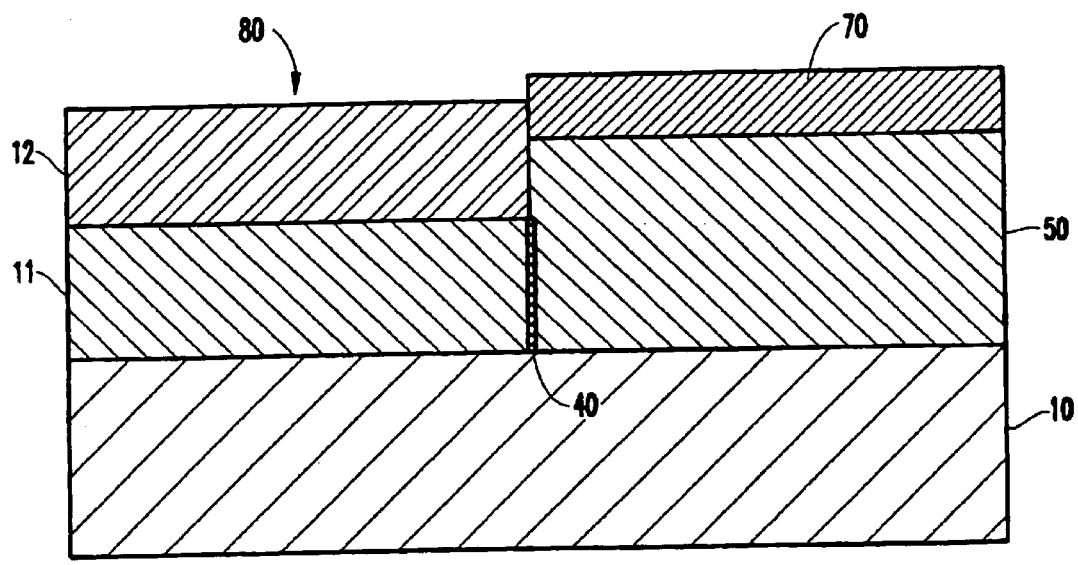
Figure 9:
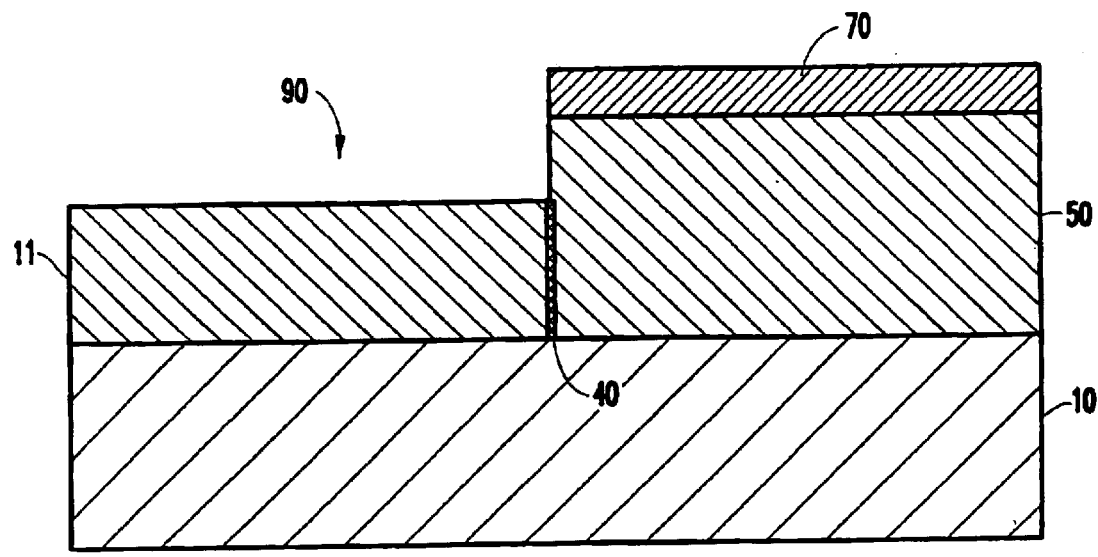

The oxide layers 70, 71 are etched at a controlled rate, as shown in FIG. 8. Once the placeholder layer 12 is exposed, the etching process is stopped. This removes all the oxide from the upper surface of the placeholder layer 12, while leaving some oxide 70 above the polysilicon layer 50. Next, in FIG. 9, the placeholder layer 12 is removed using a selected etching process, leaving the upper portion 90 of the silicon 11 exposed.

Figure 10:
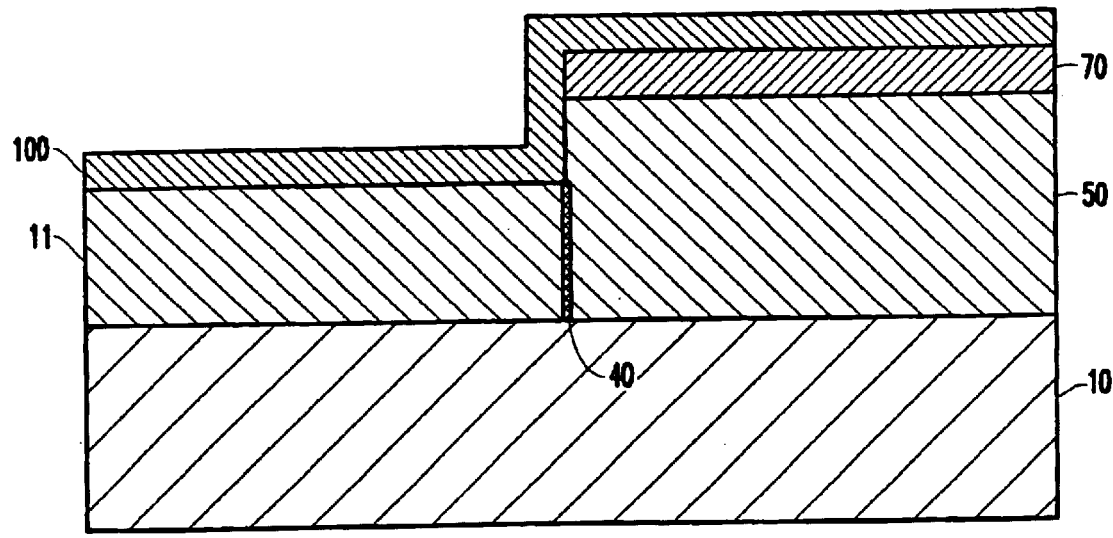
Figure 11:
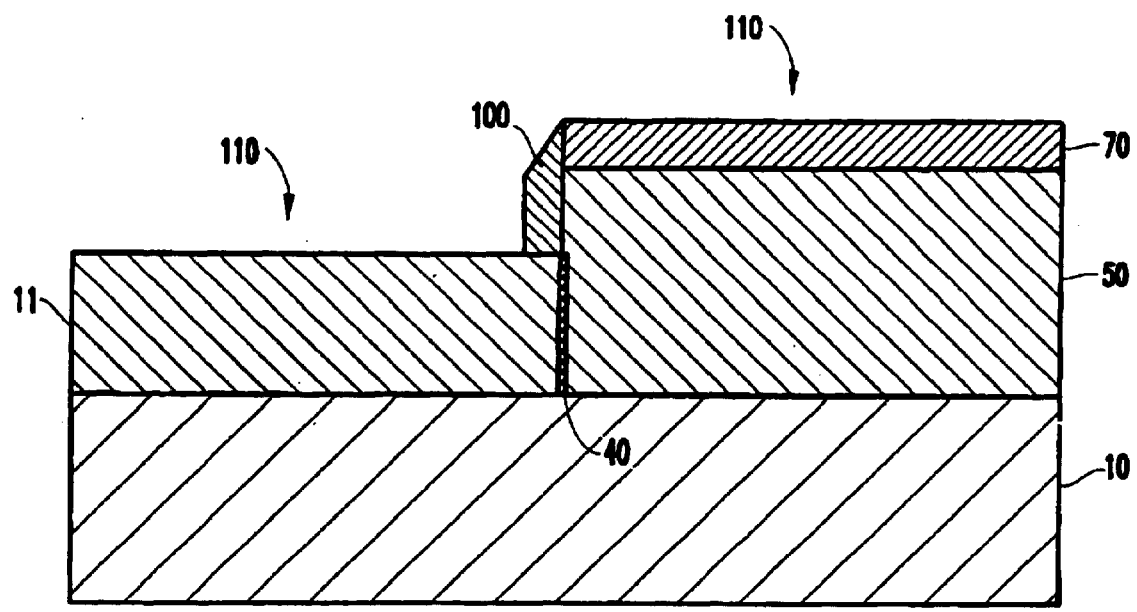
Figure 12:
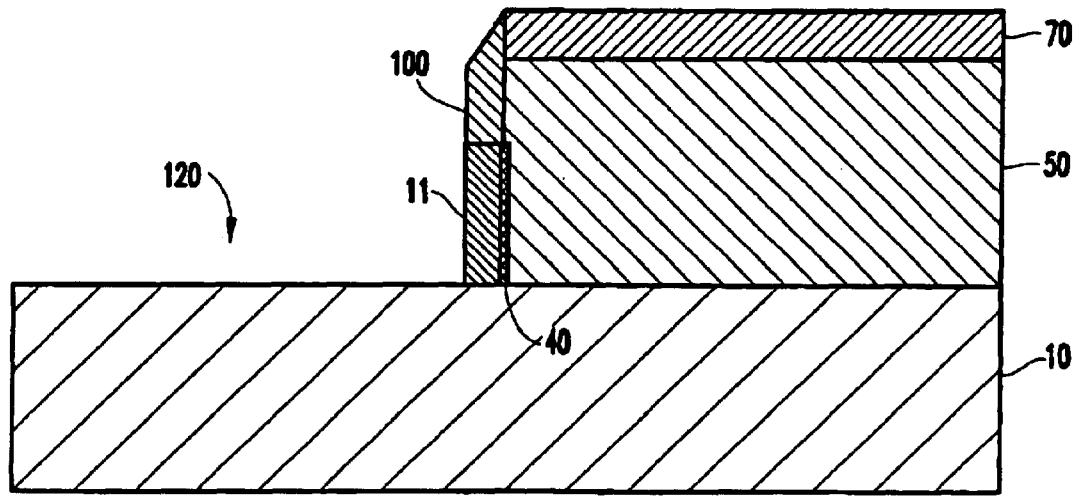

In FIG. 10, a hard mask 100 (such as TEOS, etc.) is conformally deposited over the upper layers of the structure. Then, as shown in FIG. 11, a directional anisotropic etch is used to remove the hard mask 100 from all horizontal surfaces 110, yet allow the hard mask 100 to remain upon the vertical surfaces of the polysilicon 50 and the oxide 70. In FIG. 12, the silicon 11 is patterned to remove the portion 120. Only the portion beneath the hard mask 100 remains after the patterning process.

Figure 13:
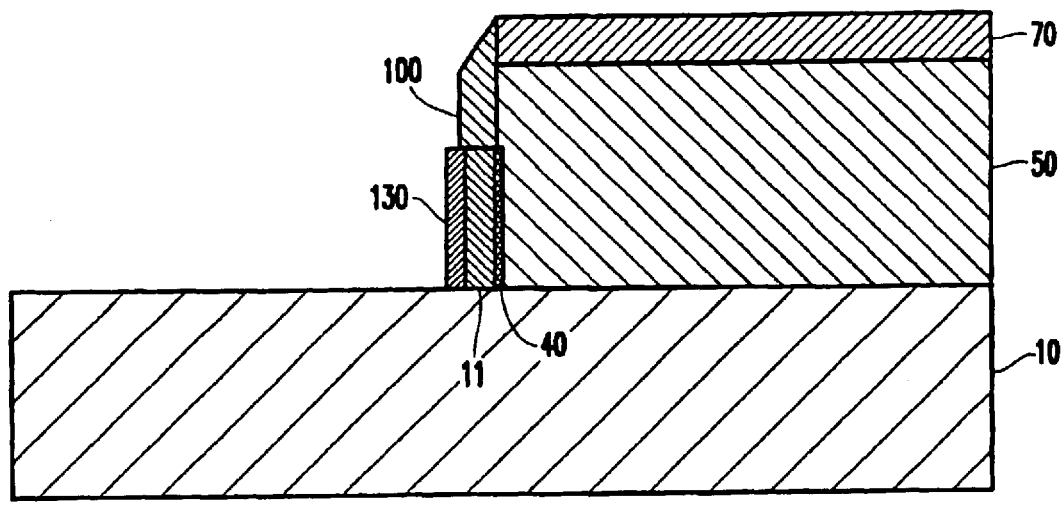

FIG. 13 illustrates the growth of selective SiGe 130. While SiGe is used in this example, the invention is not limited to such material composition. Any substance which will present a lattice mismatch with the silicon will produce stress and would be useful with the invention. More specifically, the structure is heated in a complex having Ge, which causes the SiGe 130 to grow from the silicon 11. This builds strain into the already-formed silicon channel 11. The resulting Si layer is strained due to the lattice mismatch between the SiGe and the smaller lattice constant silicon layer. Physical strain on the channel material in an FET can improve carrier mobility. Strain induced on planar p-type metal oxide semiconductor field effect tnansistor (MOSFET) devices has been shown to increase hole mobility up to 30%. This is because the strain splits the conduction and valence bands and raises the energy of the low mobility ellipsoids, depopulating them of electrons.

At the same time, excessive amounts of germanium will produce misfit dislocations that will degrade device performance. The inventors have found the optimal range of the content to be 10% to 40% germanium.

Strain is induced on conventional planar devices by use of Shallow Trench Isolation (STI) techniques. In a Fin FET, however, there is no process analogous to STI, as the buried insulator layer 10 (BOX) provides the device isolation. The invention overcomes this problem by using Silicon Germanium (SiGe) and silicon sidewall films to generate this strain on the Fin FET channel.

Figure 14:
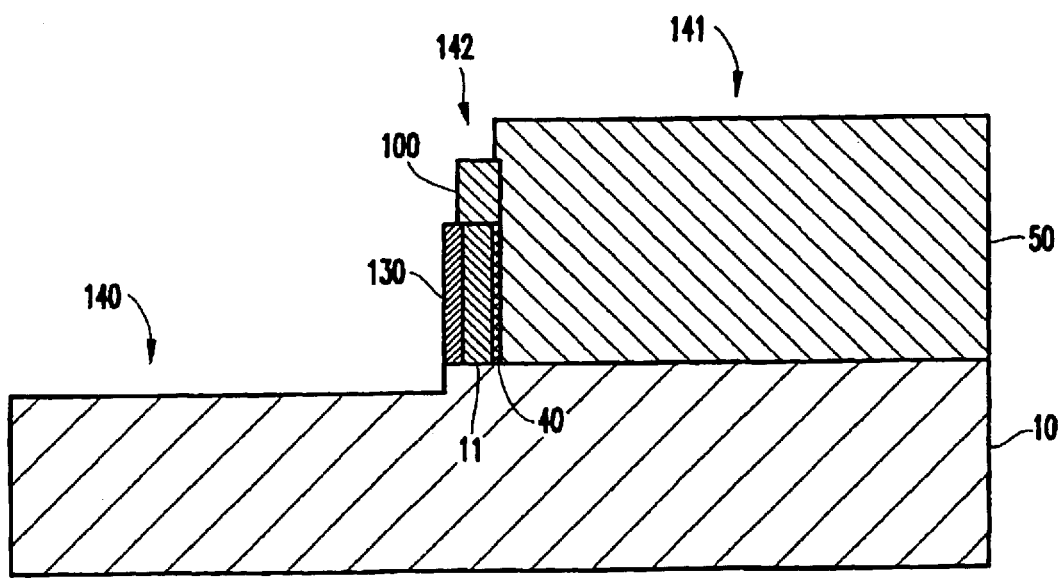
Figure 15:
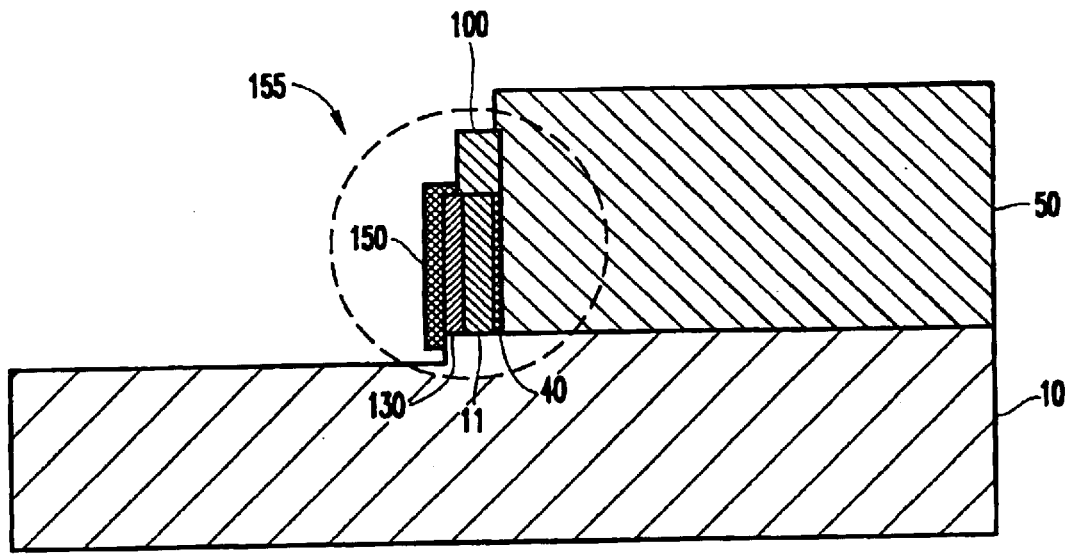

In FIG. 14, the oxide 70 is removed from the upper surface 141 of the polysilicon 50. This also reduces the height 142 of the hard mask 100 and forms a step 140 in the insulator 10. Another thermal oxidation step forms an oxide 150 over the SiGe 130 surface, as shown in FIG. 15. Alternatively, the formation of the oxide 150 could be omitted to form a dynamic threshold Fin FET. In the embodiment without the oxide 150(the dynamic threshold (DT) Fin FET) the strained Fin FET DT CMOS devices are formed with body tied to gate. This structure, including the silicon 11, gate oxide 40, hard mask 100, oxide 150, and SiGe 130, is referred to hereinafter as the "body" and is identified in the drawings as item 155 in order to simplify the description and illustration.

Figure 16:
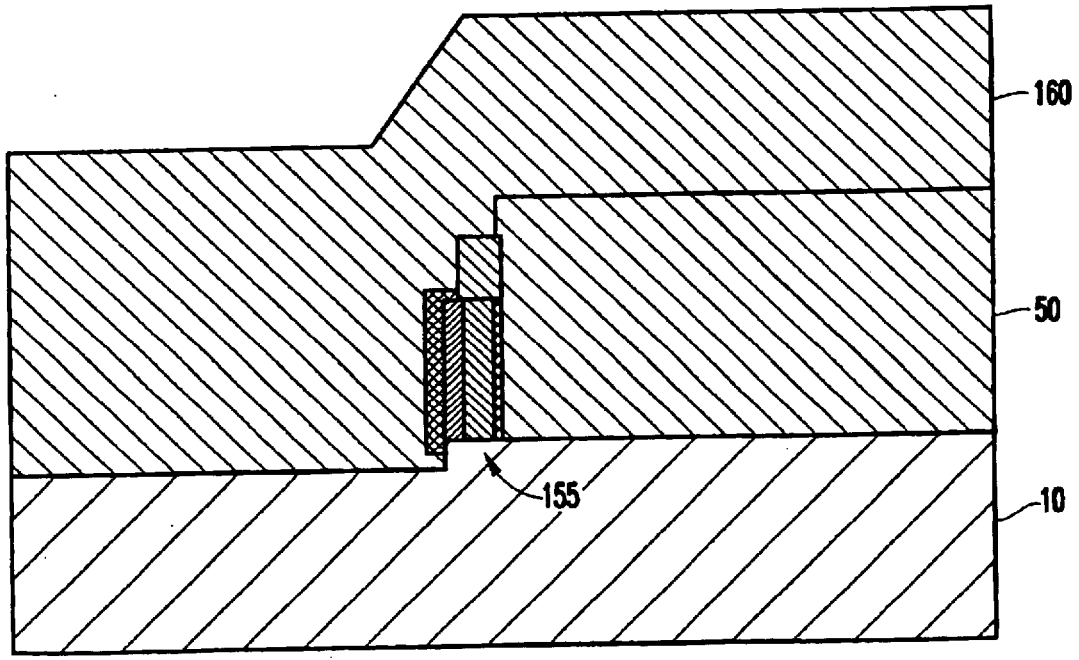
Figure 17:
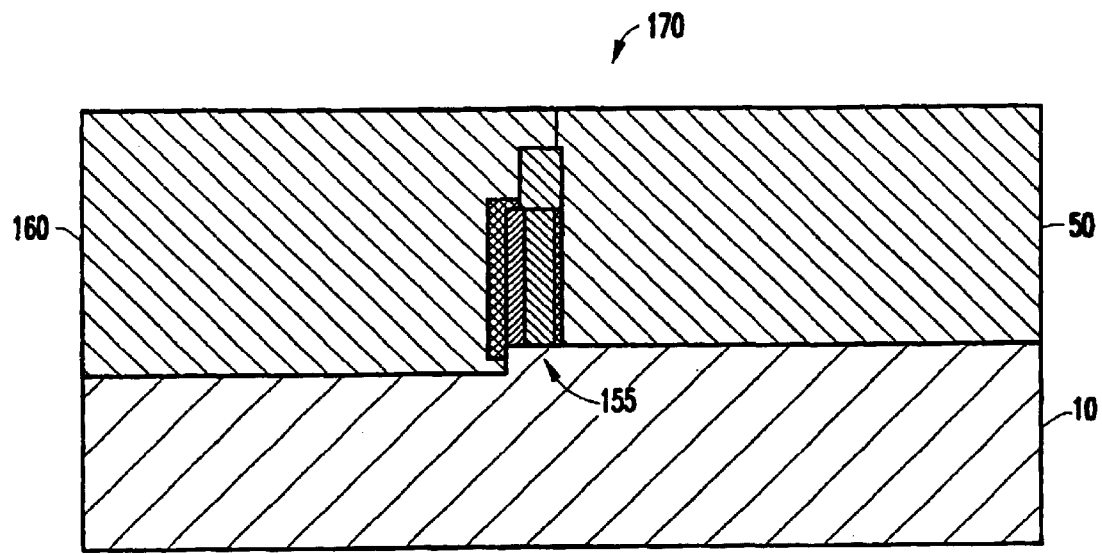

Next, in FIG. 16, a second polysilicon 160, that may be doped differently or similarly to the first polysilicon 50, is deposited over the entire structure. The structure is again planarized, forming a planar upper surface 170, as shown in FIG. 17. Since the first polysilicon 50 was an N+doped polysilicon, the second polysilicon 160 is preferably a P+polysilicon. However, the first and second polysilicon could be the same for symmetric gate devices. The two types of polysilicon could be substituted for one another, or for other types of doping now known or developed in the future. The important point is that the polysilicon regions 50, 160 existing on opposite sides of the body 155 are doped differently for asymmetric structures. The polysilicon 50, 160 could be Germanium doped or any other conductor. Utilizing differently-doped polysilicon on opposite sides of the silicon channel structure 11 creates an asymmetric gate Fin FET.

Various electrically conducting materials have associated with them a built-in electrical potential, often referred to as a fermi level, which, along with externally applied voltage, determines the relative affinity of the conductor for electrons (or holes). In a metal, the fermi level is intrinsic to the material while in a semiconductor, such as silicon, this fermi level can be adjusted to values between the valence band and conduction band by introduction of impurities which supply excess holes or electrons. In the asymmetric double gated Fin FET, the two gate electrodes 50, 160 are doped with opposite polarity, with one gate being doped N-type and the other gate being doped P-type. Thus, the two gate electrodes 50, 160 have different fermi levels and, hence, one gate electrode (the strong gate, the n-gate for nFETs) has a greater affinity for the inversion carriers while the other electrode (the weak gate, the p-gate for nFETs) has a lesser affinity for the inversion carriers. As a result, the inversion channel will form in the semiconductor body at a location nearer the "strong" gate. Thus, both gate electrodes contribute to the inversion potential, leading to a relatively low threshold voltage (e.g., between 0 and 0.5 volts).

In the embodiment being illustrated and discussed, the structure is an asymmetric Fin FET device, the silicon 11 is only etched on one side 30, and the placeholder 12 above the remaining silicon 11 is left in place. The invention grows selective single-crystal SiGe 130 on the exposed half of the Fin structure (on the side opposite the gate oxide). However, the invention is also applicable to symmetric Fin FETs, as shown later.

Figure 18:
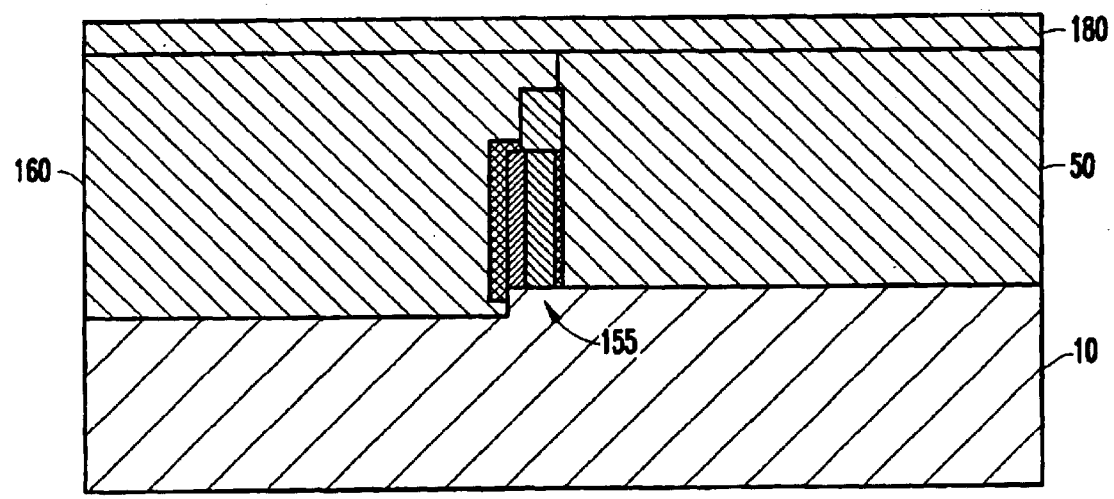
Figure 19:
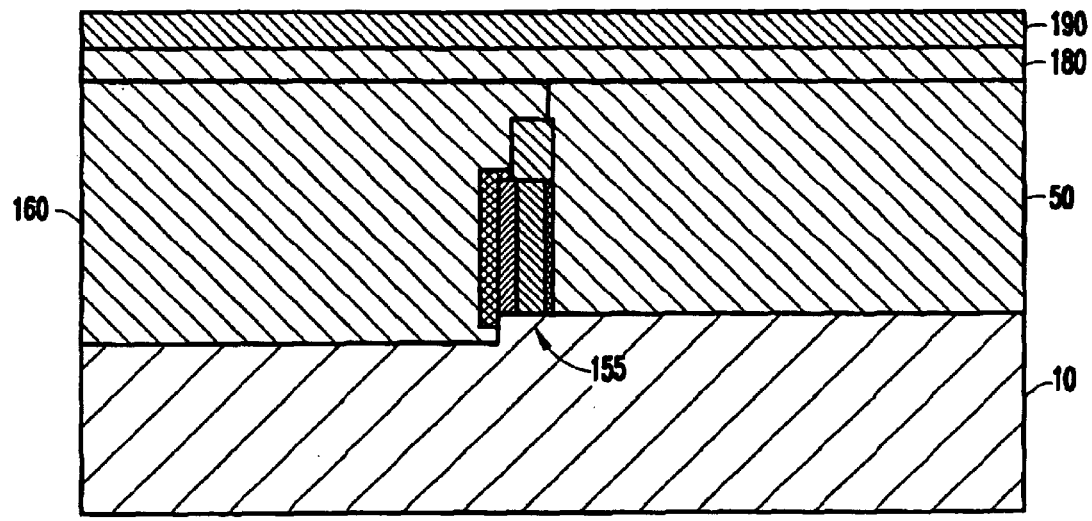
Figure 20:
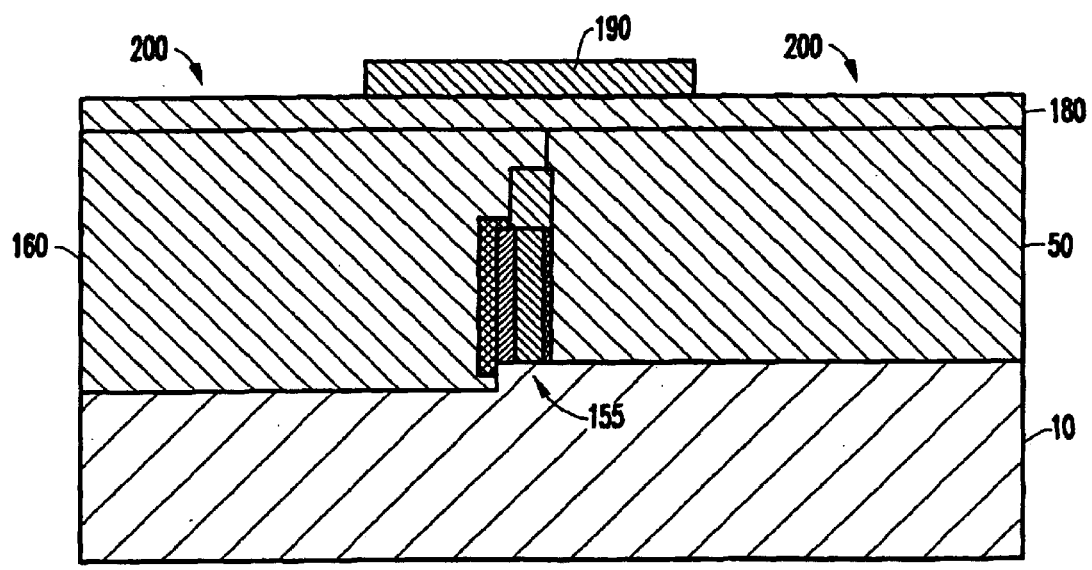
Figure 21:
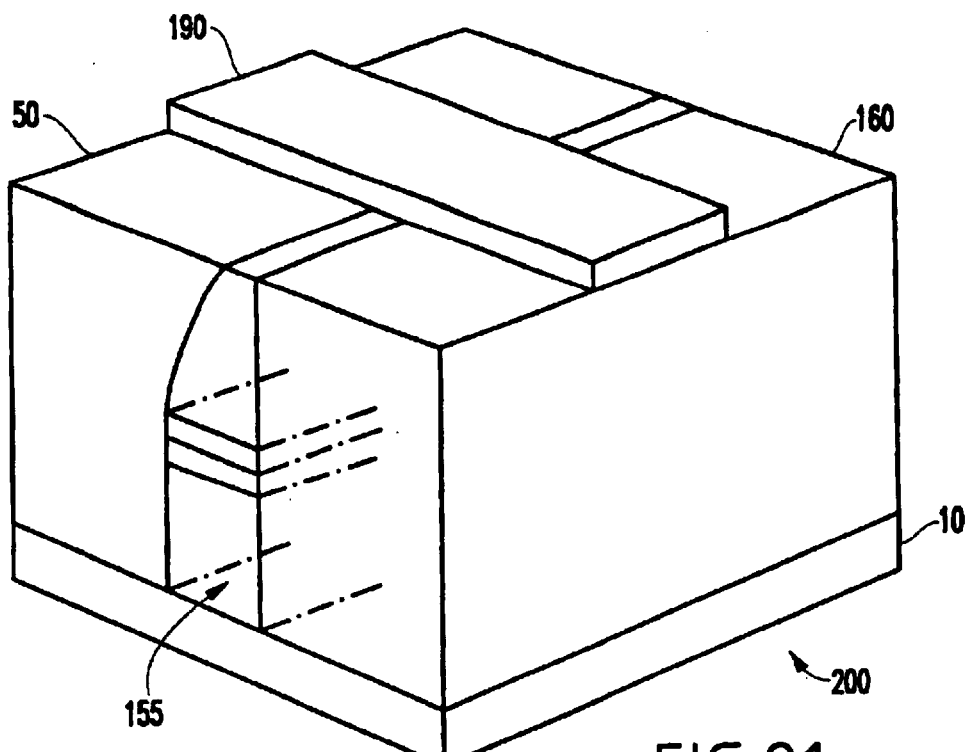
FIGS. 21, 23, and 26–28 are perspective views of the first embodiment of FET structure produced utilizing the method according to the first embodiment of the invention.
Figure 22:
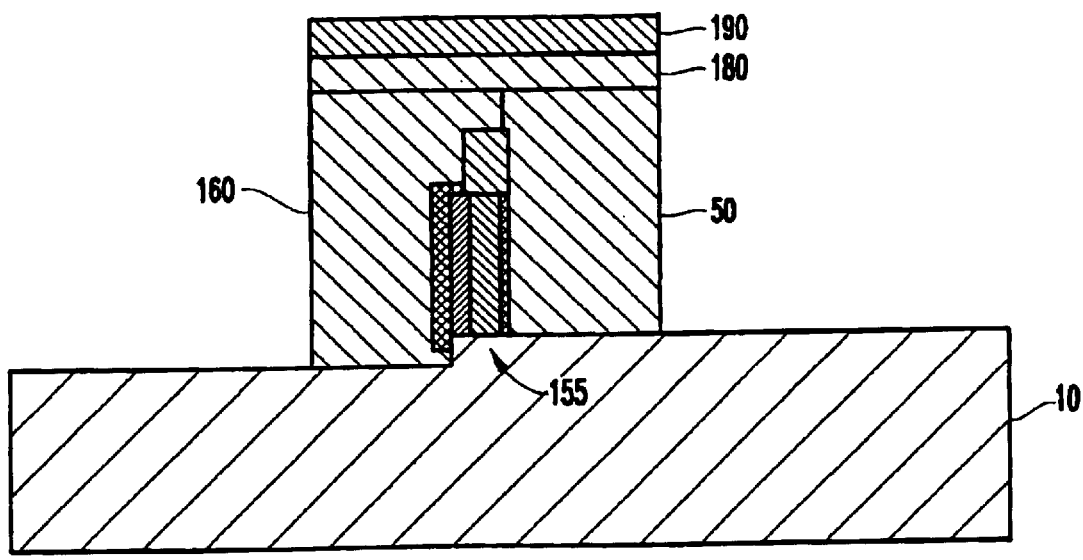
Figure 23:
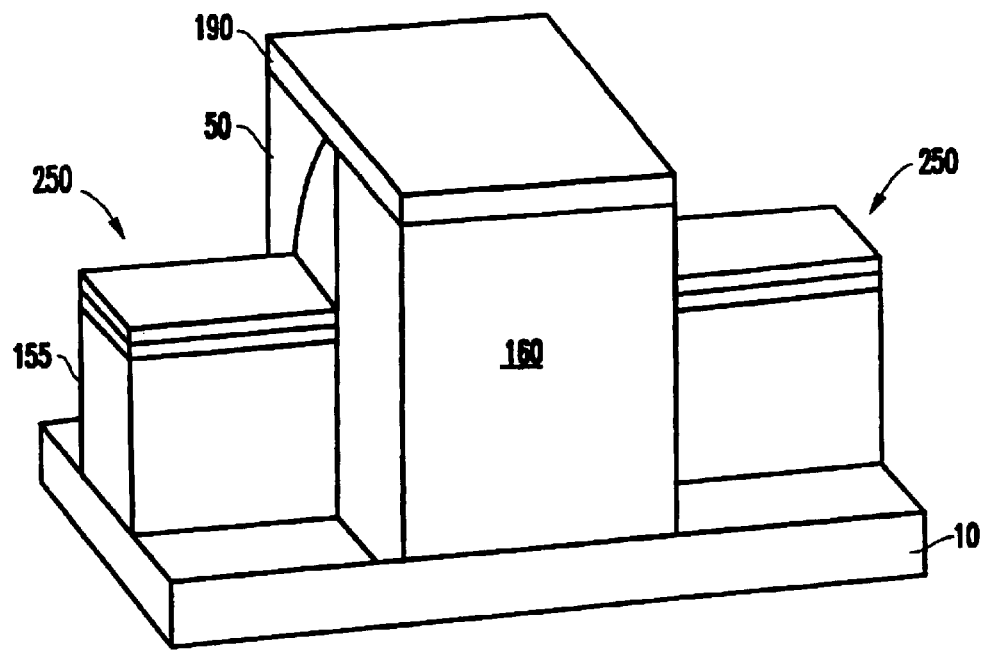
Figure 24:
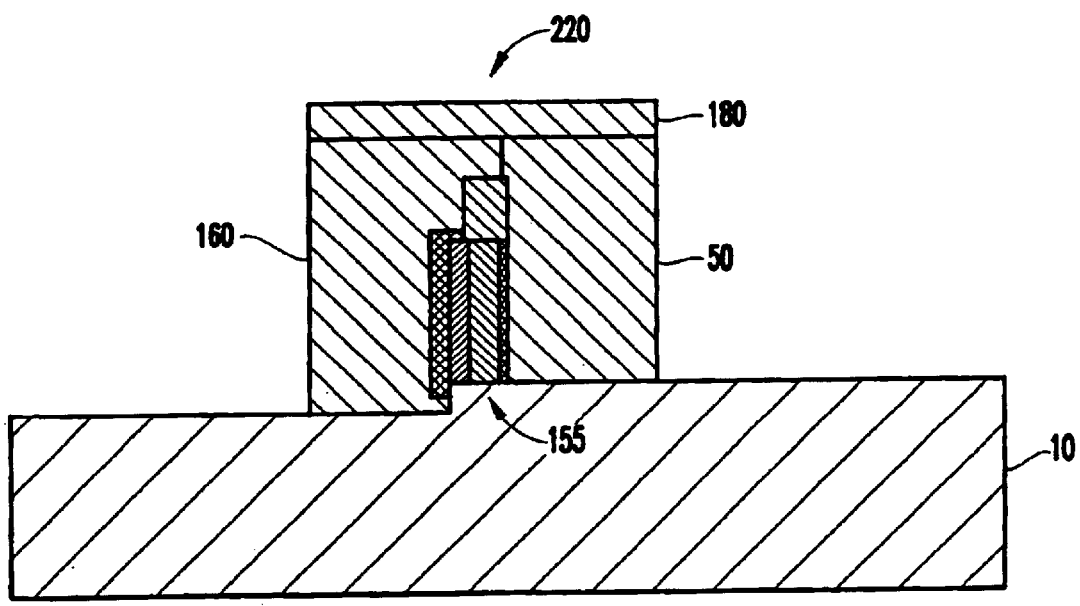

Processing proceeds, as shown in FIG. 18, with the deposition or growth of an intrinsic silicon layer 180. Then, in FIG. 19, another insulator hard mask 190 (such as TEOS, etc.) is deposited over the intrinsic silicon 18 and patterned using conventional patterning techniques to remove portions 200, as shown in FIG. 20. The same structure is shown in perspective view in FIG. 21. The polysilicon electrodes 50, 160 and intrinsic silicon 180 are patterned using the hard mask 190, as shown in FIG. 22 (and in perspective view in FIG. 23). The hard mask 190 is then removed from area 220, as shown in FIG. 24. The patterning of the gates 50, 160 preferably removes all the gate polysilicon down to the buried oxide layer 10 and is done using a directional etch that is selective to the nitride or oxide. Thus, the patterning does not remove the portions of the body 155 that are protected by the previously-formed hard mask 100. The patterning leaves a portion of polysilicon 50 and polysilicon 160, which defines the two gates of the double gated transistor. A buffered HF clean up is performed, followed by a thermal reoxidation designed to grow oxide on all the exposed silicon surfaces. This preferably forms a thin (50 angstrom) film of oxide that provides good interface when the gate meets the body.

The invention then performs well-known, conventional source, drain, and halo implants in the transistor. Preferably, these implants are made into all four directions of the exposed portions (Fins 250) of the body 155 to ensure that a uniform implant is made into both sides of the body. In particular, both the source and drain implants are made from both sides of the Fins 250 of the body 155. Then, another implant is made, with different implant energies and angles, to form the halo implants in the body 155 that improve short channel effects. The halo implants are performed at higher energies and at angles more acute with respect to the Fin 250 in order to assure placement of the halo dopant further under the gate electrodes 50, 160 than the source/drain dopants.

Figure 25:
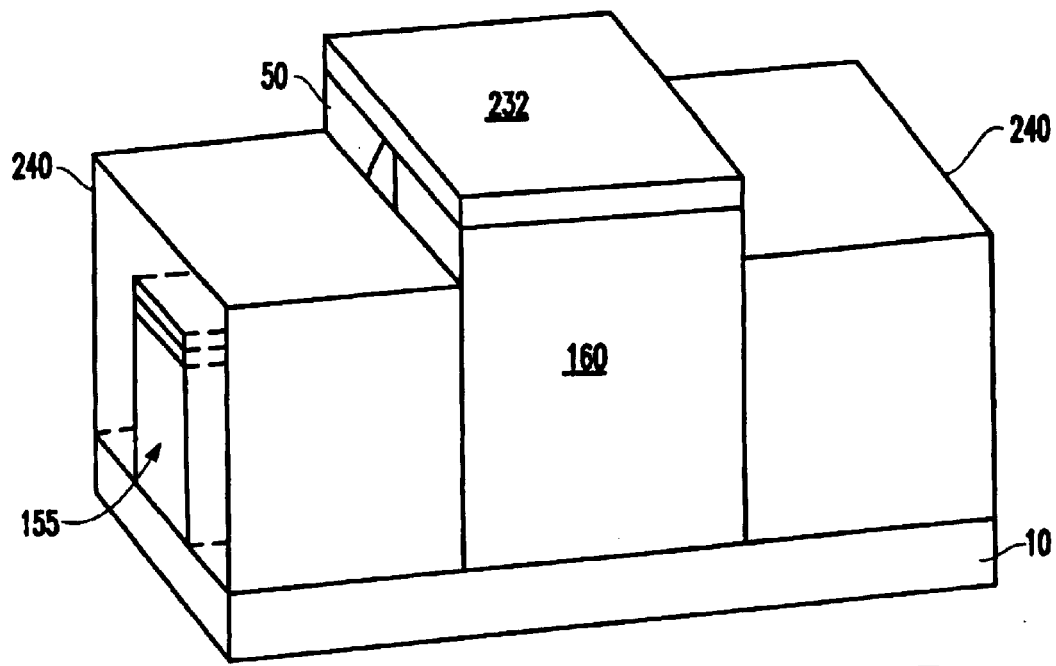
Figure 26:
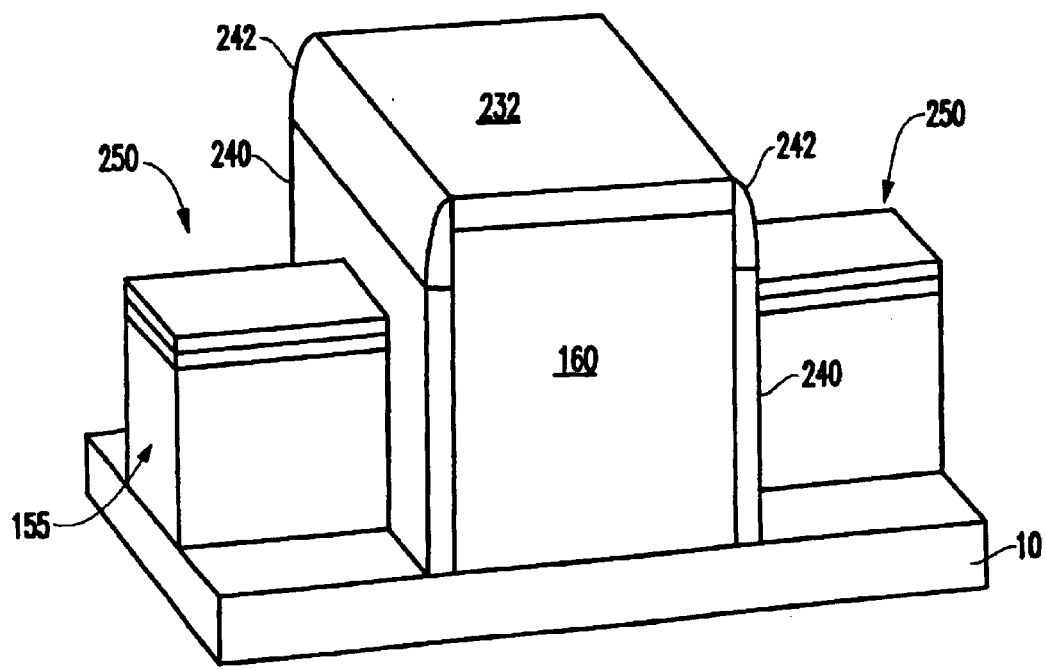
Figure 27:
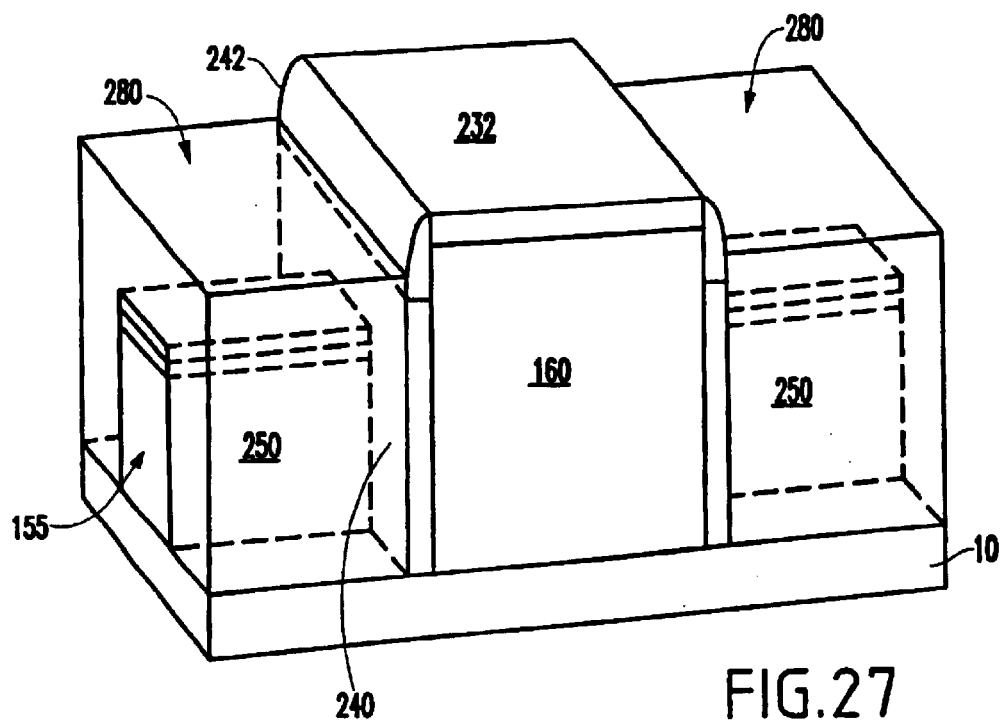

Next, the invention deposits a dielectric 240 of thickness greater than the height of the combined gate electrodes 50, 160 and hardmask 232, covering the entire gate electrodes 50, 160 and exposed Fins 250, as shown in FIG. 25. This dielectric is then planarized and partially recessed until a portion of the hardmask 232 and gate electrodes 50, 160, but not any, of the source/drain Fin region, is exposed, as shown in FIG. 25. As shown in FIG. 26, the dielectric 240 is etched to cover only the sides of the gates 50, 160 and sidewall spacers 242 are formed on the edges of the gates above the dielectric 240. This is preferably done using a conformal deposition of a dielectric material, followed by a directional etch. The sidewall spacers 242 are preferably formed of a nitride. The dielectric 240, sidewall spacers 242, and hardmask 232 are used to mask a directional etch and thereby remove the oxides 40, 150, except in areas adjacent the gates. The hardmask 232, the sidewall spacers 242, and the sidewall portions 240 combine to effectively isolate the gate 50, 160 from the source and drain 250 contacts 280, as shown in FIG. 27. Preferably, the source and drain contacts 280 comprise a patterned conductive material. Next, as shown in FIG. 28, the intrinsic silicon layer 180 is silicided using conventional, well-known silicide processes, forming silicide layer 230.

Figure 32:
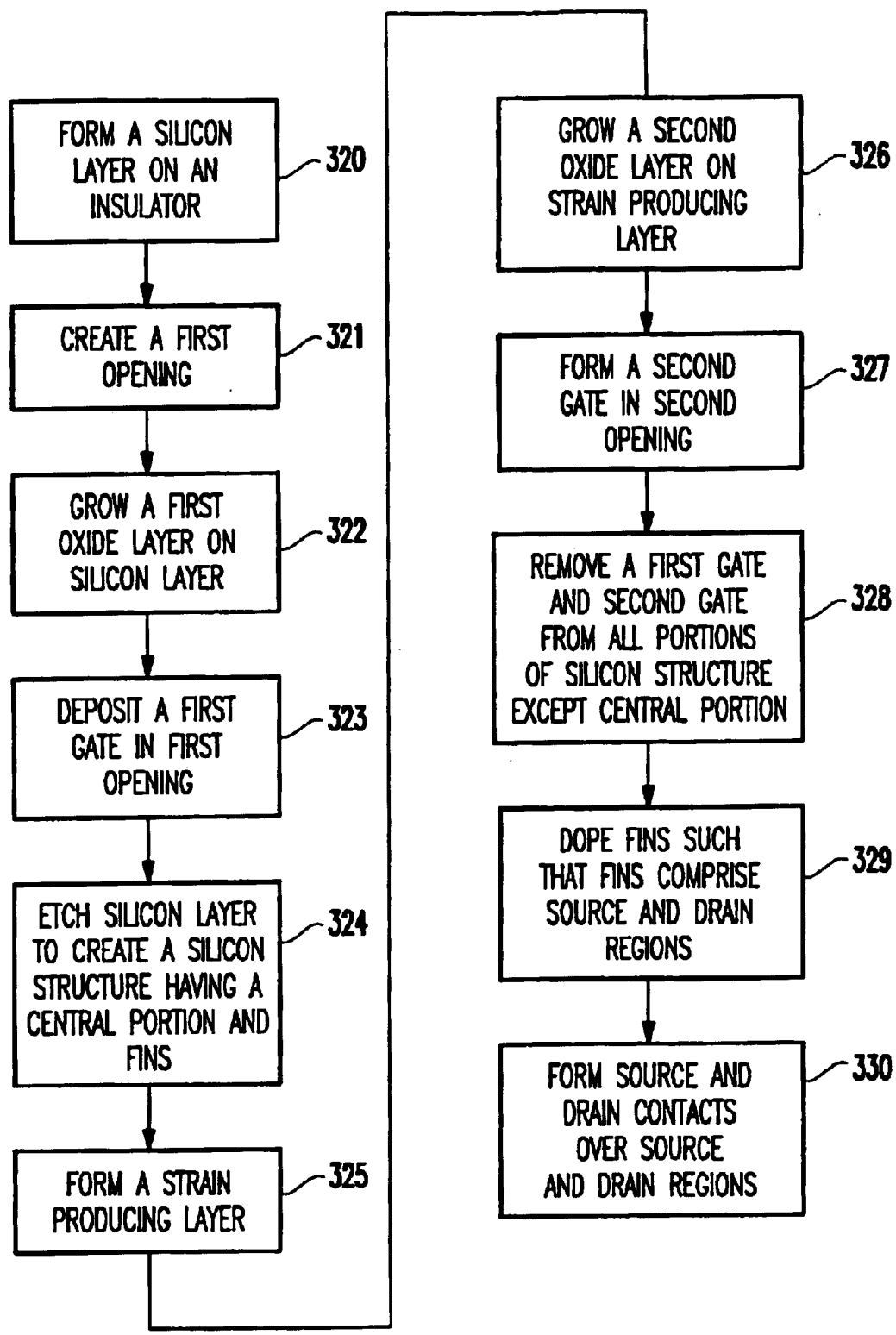
FIG. 32 is a flowchart illustrating a sequence of steps in accordance with the first embodiment of the invention.

In FIG. 32, a flow chart summarizing this first embodiment of the invention is shown. First, in item 320, the invention forms a silicon layer 11 on an insulator 10. Then, in item 321, the invention creates a first opening 30. In item 322, the invention grows a first oxide layer 40 on the silicon layer 11. Next, in item 323, the invention deposits a first gate 50 in the first opening. In item 324, the invention etches the silicon layer 11 to create a silicon structure 155 having a central portion and Fins. The invention forms a strain-producing layer 130 in item 325. Next, in item 326, the invention grows a second oxide layer 150 on the strain-producing layer 130. In item 327, the invention forms a second gate 160 in the second opening 140. Then, in item 328, the invention removes the first gate and second gate from all portions of the silicon structure except the central portion. In item 329, the invention dopes the Fins 250 such that the Fins 250 comprise source and drain regions. Lastly, in item 330, the invention forms source and drain contacts 280 over source and drain regions.

In operation, a voltage within the gates 50, 160 changes the conductivity of the region of the semiconducting silicon 11 that is covered by the gates 50, 160. This operation, either makes or breaks an electrical connection between the source and drain Fins 250. Therefore, the device can be used as an electrical switch to perform logical operations.

As mentioned above, one important feature of the invention is the SiGe layer 130 that remains as a permanent part of the body 155. More specifically, such a feature builds strain into the silicon channel 11. Physical strain on the channel material in an FET can improve carrier mobility.

While the invention is described above with respect to an asymmetric strained Fin FET, it is equally applicable to a symmetric strained Fin FET. More specifically, as shown in FIGS. 29–31, the processing necessary to create a strained symmetric strained Fin FET in accordance with a second embodiment of the invention starts with a SOI structure having a SiGe layer 300 above an insulator 10 (this is shown in FIG. 29). The SiGe layer 300 is selectively patterned, as shown in FIG. 30. Then, a silicon layer 315 is grown on the SiGe layer 300 to create a strained structure. A thermal oxide 320 is then grown on the silicon layer 315. Next, the gate conductors (e.g., polysilicon) 310 are deposited, planarized, and patterned to form the gates surrounding the body structure 155. In one embodiment, the gate conductors 310 have the same doping concentration and material makeup. However, in a different embodiment, the gate electrodes 310 can be made asymmetric with, for example, an ion implant to result in an asymmetric gate workfunction Fin FET with strain. More specifically, in the asymmetric gate arrangement, the gate conductors 310 would have different doping concentrations or utilize different dopants. Processing proceeds to complete the structure shown in FIGS. 18–28, as discussed above.

An important feature of the invention is that it provides strain within many different forms of Fin FETs. One of the strained Fin FET embodiments shown in FIGS. 1–28 utilizes an SOI arrangement to form a strained Fin FET that has either symmetric or asymmetric gate conductors. Alternatively, as explained with respect to FIG. 15, if the oxide 150 is omitted, a dynamic threshold Fin FET is formed. To the contrary, the embodiment shown in FIGS. 29–31 utilizes a SiGe-OI (silicon germanium over insulator) in place of the SOI structure shown in FIGS. 1–28. In a similar manner, the SiGe-OI structure can be formed as an asymmetric gate or symmetric gate structure, depending upon the doping of the gate conductors. The forgoing embodiments are merely illustrative of the invention and the invention is not limited to these specific embodiments. Instead, the embodiments shown above are merely examples and one ordinarily skilled in the art would understand that many different types of FinFETs would achieve beneficial results by including the inventive strain structure.

Figure 33:
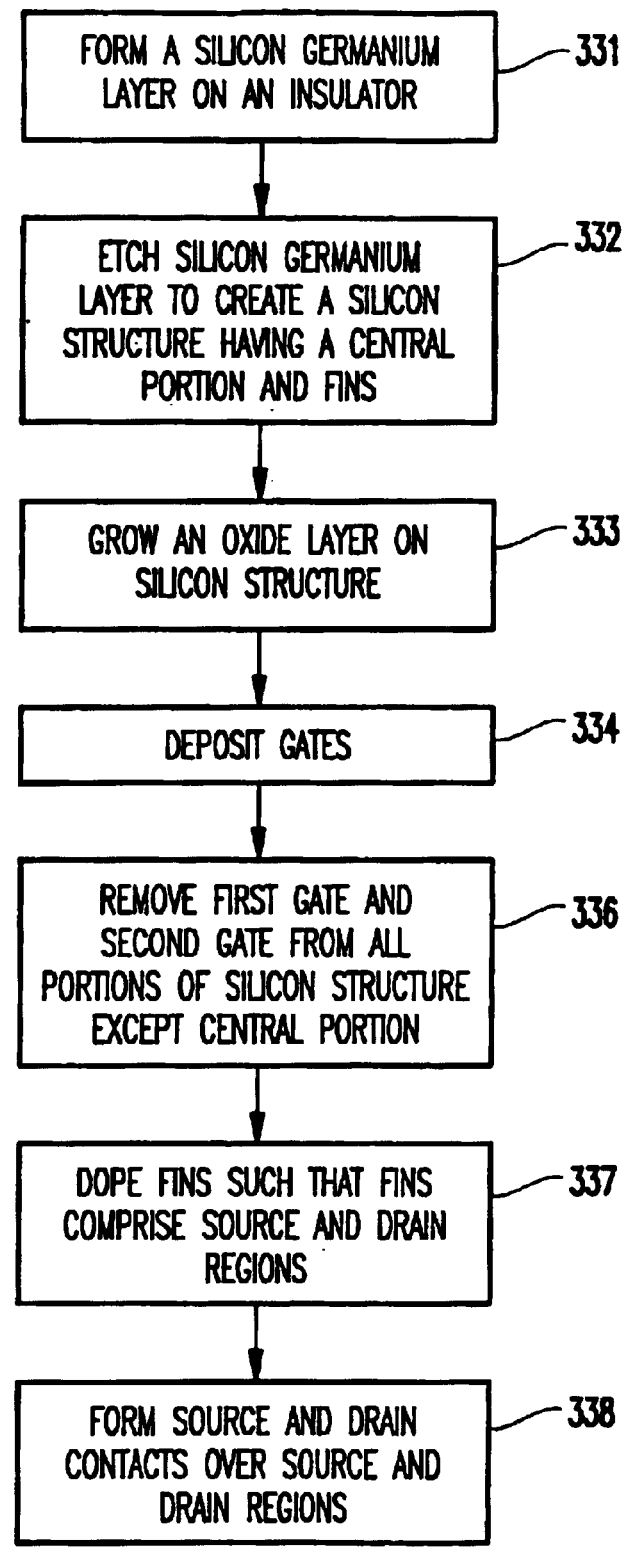
FIG. 33 is a flowchart illustrating a sequence of steps in accordance with the second embodiment of the invention.

In FIG. 33, a flow chart for constructing a symmetric strained Fin field effect transistor, in accordance with a second embodiment of the invention, is shown. First, in item 331,the method forms a silicon germanium layer 300 on an insulator 10. Next, in item 332, the method etches a silicon germanium layer to create a silicon structure that has a central portion and Fins 250. In item 333, the method grows an oxide layer 320 on silicon structure 300. In item 334, the method deposits gates on sides of the silicon structure. Next, in item 336, the method removes the first gate and second gate from all portions of the silicon structure except the central portion. In item 337, the method dopes the Fins 250 such that the Fins 250 are source and drain regions. Lastly, in item 338, the method forms source and drain contacts 280 over source and drain regions.

As mentioned above, the SiGe layer 130 builds strain into the already-formed silicon channel 11. Physical strain on the channel material in FET can improve carrier mobility. Strain induced on planar p-type metal oxide semiconductor field effect transistor (MOSFET) devices has been shown to increase hole mobility up to 30%. This invention provides these advantages to thin semiconductor bodies that are vertically arranged on a substrate; and as such, the invention combines greater channel control with greater carrier mobility.

While the invention has been described in terms of preferred embodiments, those skilled in the art will recognize that the invention can be practiced with modification within the spirit and scope of the appended claims. For example, while the invention has been taught with reference to a particular method of forming vertical semiconductor bodies, other methods of producing discrete semiconductor bodies on a substrate could be used (e.g., silicon islands on a SOI substrate). Moreover, while SiGe is taught as the primary material to induce the requisite strain in the channel region, other materials could be used. Finally, the invention is applicable to other semiconductors (e.g., Group III–IV semiconductors such as gallium arsenide).

What is claimed is:

1. A method of forming a transistor comprising:
   forming a silicon layer on an insulator;
   etching a first portion of said silicon layer to create a first opening;
   depositing a first gate in said first opening;
   etching a second portion of said silicon layer to create a second opening opposite said first opening, wherein after said etching of said second portion, said silicon layer comprises a silicon structure on said insulator having a central portion and Fins extending from ends of said cent portion;

forming a strain-producing layer upon a portion of said silicon structure facing said second opening;

forming a second gate in said second opening; and removing said first gate and said second from all portions of said silicon structure except said central portion.

2. The method in claim 1, further comprising doping said Fins such that said Fins comprise source and drain regions.

3. The method in claim 1, wherein said silicon germanium has a sufficient concentration of germanium to produce strain within said central portion to enhance carrier mobility, without producing sufficient dislocations to reduce overall performance of said Fin field effect transistor.

4. The method in claim 2, wherein said concentration of germanium is between 10% and 40%.

5. A method of forming an asymmetric strained Fin field effect transistor comprising:

forming a silicon layer on an insulator;

etching a first portion of said silicon layer to create a first opening;

depositing a first gate in said first opening;

etching a second portion of said silicon layer to create a second open opposite said first opening, wherein after said etching of said second portion, said silicon layer comprises a silicon structure on said insulator having a central portion and Fins extending from ends of said central portion;

forming a silicon germanium layer upon a portion of said silicon structure facing said second opening;

forming a second gate in said second opening, wherein said first gate and said second are doped differently; and removing said first gate and said second gate from all portions of said silicon structure except said central portion.

6. The method in claim 5, further comprising doping said Fins such that said Fins comprise source and drain regions.

7. The method in claim 5, wherein said silicon germanium has a sufficient concentration of germanium to produce strain within said central portion to enhance carrier mobility, without producing sufficient dislocations to reduce overall performance of said Fin field effect transistor.

8. The method in claim 6, wherein said concentration of germanium is between 10% and 40%.

9. A method of forming strained Fin field effect transistor comprising: forming a silicon structure on an insulator;

forming stress on one side of said silicon structure, having a central portion and Fins extending from ends of said central portion;

depositing a first gate and a second gate on sides of said silicon structure; and removing said first gate and said second gate from all portions of said silicon structure except said central portion.

10. The method in claim 9, wherein said first gate and said second gate are doped similarly.

11. The method in claim 9, wherein said first gate and said second gate are doped differently.

12. The method in claim 10, further comprising doping said Fins such that said Fins comprise source and drain regions.

13. The method in claim 9, wherein said silicon germanium has a sufficient concentration of germanium to produce strain within said central portion to enhance carrier mobility, without producing sufficient dislocations to reduce overall performance of said Fin field effect transistor.

14. The method in claim 13, wherein said concentration of germanium is between 10% and 40%.

15. A method of forming a transistor comprising:

forming a silicon germanium layer on an insulator;

etching said silicon germanium layer to create a central portion and Fins extending from ends of said central portion;

growing a strained silicon layer on one side of said silicon germanium layer;

growing a thermal oxide on said strained silicon layer; and growing gate conductors on said thermal oxide.

16. The method in claim 15, further comprising doping said Fins such that said Fins comprise source and drain regions.

17. The method in claim 15, wherein said silicon germanium has a sufficient concentration of germanium to produce strain within said strained silicon layer to enhance carrier mobility, without producing sufficient dislocations to reduce overall performance of said transistor.

18. A method of forming a transistor comprising:

forming a silicon germanium layer on an insulator;

etching said silicon germanium layer to create a central portion and Fins extending from ends of said central portion;

growing a strained silicon layer on said silicon germanium layer;

growing a thermal oxide on said strained silicon layer; and growing gate conductors on said thermal oxide;

wherein said silicon germanium has a sufficient concentration of germanium to produce strain within said strained silicon layer to enhance carrier mobility, without producing sufficient dislocations to reduce overall performance of said transistor; and wherein said concentration of germanium is between 10% and 40%.

* * * * *